Oct. 7, 1969 C. F. McAFEE 3,471,756
METAL OXIDE-SILICON DIODE CONTAINING COATING OF VANADIUM PENTOXIDE-$V_2O_5$ DEPOSITED ON n-TYPE MATERIAL WITH NICKEL ELECTRODES
Filed March 11, 1968
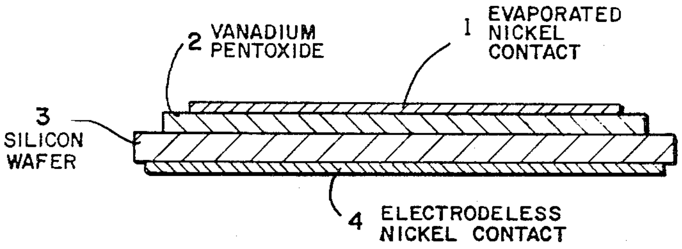
INVENTOR,
CHARLES F. McAFEE.
BY Roy E. Gordon — AGENT
Harry M. Saragovitz,
Edward J. Kelly & Herbert Berl
ATTORNEYS.

3,471,756
Patented Oct. 7, 1969

3,471,756

METAL OXIDE-SILICON DIODE CONTAINING COATING OF VANADIUM PENTOXIDE-$V_2O_5$ DEPOSITED ON n-TYPE MATERIAL WITH NICKEL ELECTRODES

Charles F. McAfee, West Allenhurst, N.J., assignor to the United States of America as represented by the Secretary of the Army Filed Mar. 11, 1968, Ser. No. 712,023
Int. Cl. H01l *3/00, 5/00*
U.S. Cl. 317—234 1 Claim

ABSTRACT OF THE DISCLOSURE

A semiconductor diode is provided including an n-type wafer of silicon. A coating of vanadium pentoxide is provided on one of the surfaces of the wafer. Nickel contacts are provided to the oxide coating and to the other surface of the wafer.

The invention described herein may be manufactured, used, and licensed by or for the Government for governmental purposes without the payment to me of any royalty thereon.

Background of the invention

This invention relates to a semiconductor diode of improved electrical characteristics.

Heretofore, it has been known that variable capacitor diodes such as the metal oxide-silicon diode can be used as frequency generators, voltage tunable capacitors, etc. These diodes have not been entirely satisfactory in that their capacitance swing with a change in reverse bias has been limited. This has limited the tunability range of the conventional metal oxide-silicon diode.

An object of this invention is to provide a semiconductor diode having wider capacitance swings and higher *dc/dv* than the conventional metal oxide-silicon diode. A still further object of this invention is to provide such a diode that will be compatible with integrated circuits.

Summary of the invention

The semiconductor diode according to the invention is comprised of n-type silicon as for example, a wafer of n-type silicon. Upon one surface of the wafer is an evaporated coating of vanadium pentoxide. Nickel is coated on the oxide coating to achieve ohmic contact to the oxide. Similarly, nickel is also coated on the subsurface of the silicon wafer to achieve ohmic contact to the silicon.

Brief description of the drawing

The invention can best be understood by referring to the drawing wherein there is shown a cross-section of the semiconductor diode.

Referring to the drawing, a wafer of n-type silicon 3 is provided on one of its surfaces with a coating of vanadium pentoxide 2. The semiconductor diode is completed by a nickel contact 1 to the oxide and a nickel contact 4 to the sub-surface of the silicon wafer 3.

The semiconductor diode can be prepared by conventional methods recognized in the art. For example, one can use commercially available, polished 12-ohm centimeter n-type silicon wafers of 8 to 10 mils in thickness. The wafers are first cleaned. Vanadium pentoxide is then vacuum deposited on the polished surrface of the wafer and the resulting structure fired at 700° C. in an open tube air ambient annealing furnace for 30 minutes. Nickel is vacuum deposited on the vanadium pentoxide coating and the diode completed by depositing nickel on the sub-surface of the silicon wafer from an electrodeless nickel bath.

Reverse breakdown of the diode is 80 volts or higher, varying with oxide thickness. Capacitance variation with frequency at zero bias was determined over the range 15 kHz.–5 mHz. The data showed a decrease in capacitance with a frequency from 2,750 nf. at 15 kHz. to 0.250 nf. at 5 mHz. Capacitance variations with bias for various frequencies, over the range 100 kHz.–5 mHz., were also determined. For the frequency range, 100 kHz.–2 mHz., it was determined that capacitance increased with forward bias, attained a maximum value in the interval 0.3 to 1.5 volts above zero bias, and decreased thereafter with increased forward bias. Each peak capacitance value occurred at successively lower forward bias values as frequency increased. Capacitance ratios greater than 60:1 were obtained for the frequency range 100 kHz. through 1 mHz. with more than 60% of the change occurring within the interval 0.4 to 0.6 volt with reverse bias.

The curves showed good reproducibility for diodes on the same wafer and also from wafer to wafer. The higher reproducibility and wider voltage swing is attributed to the fact that impurity redistribution is absent in $V_2O_5$ evaporated diodes. From the frequency dependencies observed, it is concluded that most capacitance changes are produced by surface state rather than by depletion layer capacitance.

The foregoing description is to be considered merely as illustrative of the invention and not in limitation thereof.

What is claimed is:

1. A semiconductor diode comprising an n-type silicon wafer, one surface of said wafer bearing a coating of vanadium pentoxide, and nickel contacts on said oxide coating and the other surface of said wafer.

References Cited

UNITED STATES PATENTS

| | | | |
|---|---|---|---|
| 3,426,251 | 2/1969 | Prokopowicz | 317—230 |
| 3,204,159 | 8/1965 | Bramley | 317—235 |
| 1,912,223 | 5/1933 | Ruben | 317—230 X |
| 3,106,489 | 10/1963 | Lepselter | 117—217 |

JOHN W. HUCKERT, Primary Examiner

B. ESTRIN, Assistant Examiner

U.S. Cl. X.R.

317—235, 238, 258